United States Patent
Celii et al.

(10) Patent No.: US 7,560,385 B2
(45) Date of Patent: Jul. 14, 2009

(54) ETCHING SYSTEMS AND PROCESSING GAS SPECIE MODULATION

(75) Inventors: Francis G. Celii, Dallas, TX (US); Ping Jiang, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 220 days.

(21) Appl. No.: 10/263,981

(22) Filed: Oct. 3, 2002

(65) Prior Publication Data

US 2003/0073312 A1     Apr. 17, 2003

Related U.S. Application Data

(60) Provisional application No. 60/330,237, filed on Oct. 17, 2001.

(51) Int. Cl.
*H01L 21/302* (2006.01)

(52) U.S. Cl. ............... 438/695; 438/700; 438/733; 438/740; 438/744

(58) Field of Classification Search ............... 438/695, 438/700, 706, 723, 724, 733, 740, 744; 252/79.1, 252/79.4
See application file for complete search history.

(56) References Cited

U.S. PATENT DOCUMENTS

| 5,337,207 | A  | * | 8/1994  | Jones et al. | ...... | 361/321.1 |
|---|---|---|---|---|---|---|
| 6,083,845 | A  | * | 7/2000  | Yang et al. | ...... | 438/734 |
| 6,191,042 | B1 | * | 2/2001  | Tsai et al. | ...... | 438/700 |
| 6,225,234 | B1 | * | 5/2001  | Miller et al. | ...... | 438/734 |
| 6,329,292 | B1 | * | 12/2001 | Hung et al. | ...... | 438/706 |
| 6,333,232 | B1 | * | 12/2001 | Kunikiyo | ...... | 438/296 |
| 6,569,774 | B1 | * | 5/2003  | Trapp | ...... | 438/706 |
| 6,617,253 | B1 | * | 9/2003  | Chu et al. | ...... | 438/702 |
| 7,141,504 | B1 | * | 11/2006 | Bhardwaj | ...... | 438/700 |
| 2002/0182880 | A1 | * | 12/2002 | Zhu et al. | ...... | 438/724 |

* cited by examiner

*Primary Examiner*—Binh X Tran
(74) *Attorney, Agent, or Firm*—Jacqueline J. Garner; Wade J. Brady, III; Frederick J. Telecky, Jr.

(57) ABSTRACT

A method and system for etching a substrate control selectivity of the etch process by modulating the gas specie of the reactants. The gas specie selectively form and etch a buffer layer that protects underlying etch stop materials thereby providing highly selective etch processes.

19 Claims, 2 Drawing Sheets

ETCHING SYSTEMS AND PROCESSING GAS SPECIE MODULATION

This application claims priority under 35 USC § 119(e)(1) of provisional application No. 60/330,237 filed Oct. 17, 2001.

TECHNICAL FIELD OF THE INVENTION

This invention relates in general to the field of semiconductor processing and more particularly to an improved etching system using processing gas specie modulation.

BACKGROUND OF THE INVENTION

Semiconductor devices are the key elements for the majority of electronic systems, including communications, consumer, data-processing, and industrial-control equipment. As discrete components, semiconductors have wide applications because they have a wide range of current- and voltage-handling capabilities and because they lend themselves to integration into complex but readily manufacturable microelectronic circuits.

Most semiconductor circuit chips are manufactured through a process called fabrication, a series of procedures through which semiconductor devices are formed in and on the surface of a polished wafer. Fabrication involves a sequence of procedures, including layering thin sheets of materials on the surface of the wafer, patterning to define the geometric features of the chip, doping, and annealing. The patterning process of fabrication entails creating a pattern on the surface of a wafer by utilizing photolithographic processes to transfer the desired pattern from a photomask to the surface of the wafer. An etching process may then be introduced to remove the external material of the wafer that is not covered by photoresist material.

In etching, material is selectively removed from the surface of the wafer in order to define the structure of a inwardly disposed layer. One method of etching, called plasma etching, uses gases in a plasma state to remove unwanted material from the surface of the wafer. The plasma etch process is accomplished by exposing the wafer to a gas plasma, which chemically reacts with the material to be removed and physically removes it.

Because it is impossible to etch materials located at different points on the surface of the wafer at exactly the same rate, it is extremely advantageous to utilize etching methods having high degrees of selectivity in the manufacturing process in that the processes are able to etch one material at a higher rate than another. Therefore, a need has arisen for a method that overcomes the disadvantages of existing processes and allows for a higher range of selectivity in the etching process. Although previous inventions have attempted to overcome this problem by utilizing variations of power modulation in plasma etching processes, such methods result in ranges of selectivity that continue to be somewhat limited.

SUMMARY OF THE INVENTION

According to the teachings of the present invention, a method of plasma etching is disclosed which substantially eliminates or reduces disadvantages associated with prior systems and methods.

According to one embodiment of the present invention, a method of processing a semiconductor workpiece is provided that comprises exposing the workpiece to a first plasma chemistry for a period of time where the first chemistry is operable to etch at a first rate a layer associated with the workpiece. The workpiece is then exposed to a second plasma chemistry that etches the layer at a second rate and also forms a guard layer that acts to buffer the etch process.

An important technical advantage of the present invention inheres in the fact that the use of separate etch chemistries allows for the modulation of the formation of the guard layer and thereby provides for very high selectivity in the overall process.

BRIEF DESCRIPTION OF THE DRAWINGS

For a more complete understanding of the present invention, and its advantages thereof, reference is now made to the following description taken in conjunction with the accompanying drawings in which.

DETAILED DESCRIPTION OF THE DRAWINGS

Figure 1:
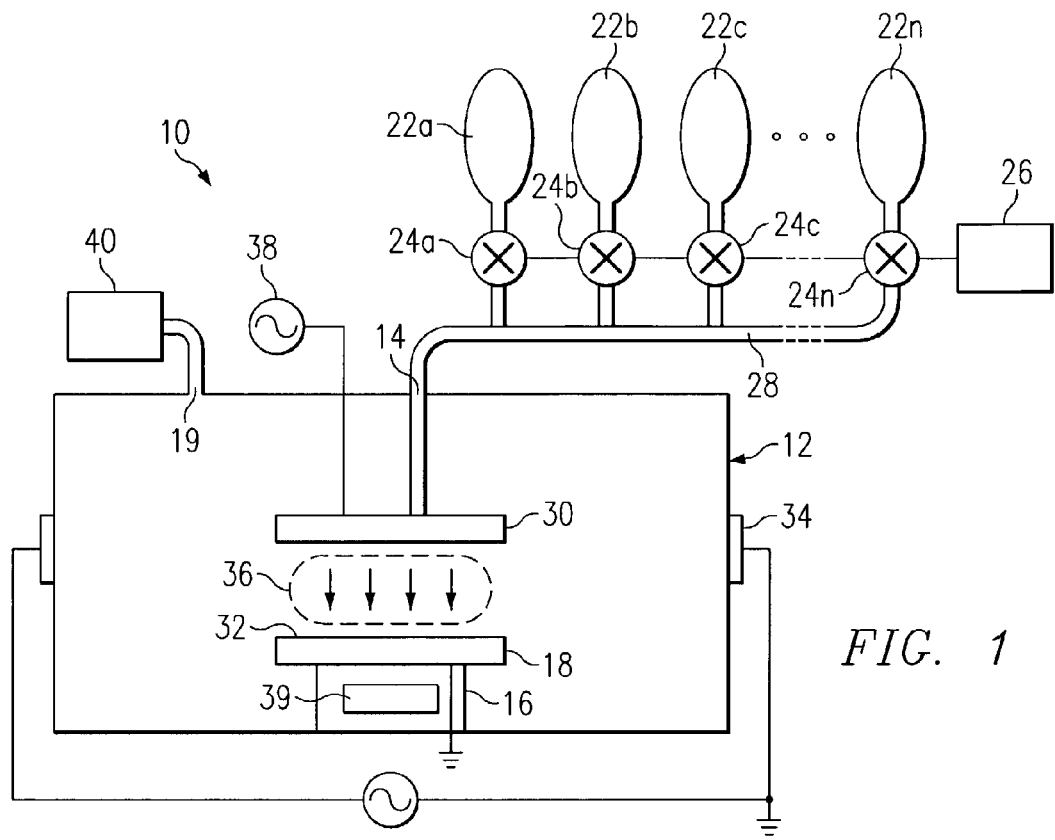
FIG. 1 is a schematic block diagram illustrating one embodiment of a plasma-enhanced chemical vapor etch (PECVE) system constructed according to the teachings of the present invention.

FIG. 1 is a schematic block diagram illustrating one embodiment of a plasma-enhanced chemical vapor etch (PECVE) system 10 constructed according to the teachings of the present invention. The PECVE system 10 utilizes plasma to transfer energy to reactant gases and allows the gas flow compositions to be modulated in such a way that a wafer substrate may be etched with enhanced selectivity.

Referring to FIG. 1, the system 10 comprises a hermetically sealed reaction chamber 12. An inlet port 14 is disposed on one side of the chamber 12 and introduces reactant gases into the reaction chamber 12. A chuck 16 is fixed to one inside wall of the chamber 12. The chuck 16 holds a wafer substrate 18 in the reaction chamber 12. An outlet port 19 is disposed on one side of the chamber and is utilized to evacuate reactant gases from the reaction chamber 12.

The inlet port 14 is connected to a plurality of reactant gas sources 22. Each gas source 22 is coupled with a variable flow controller 24. The variable flow controllers 24 are coupled with a master flow controller 26 which regulates the flow of gases through each variable flow controller 24 and into a mixing manifold 18. The master flow controller 26 is operable to control the amount of gas released from each gas source 12 to the mixing manifold 18. The mixing manifold 18 mixes the gases before the gas mixture is introduced into the reaction chamber 12 through the inlet port 14. It should be understood that in various embodiments of the present invention reactant gases may be otherwise provided to the reaction chamber 12 without departing from the spirit of the present invention, as long as the ratios of the reactant gases in the reaction chamber 12 can be adequately controlled.

The inlet port 14 is coupled with a dispersion manifold 30 in the reaction chamber 12. The dispersion manifold 30 disperses reactant gases equally across a surface 32 of the wafer substrate 18. A plasma field source 34 is coupled with either side of the reaction chamber 12 to generate a plasma 36 (glow discharge). The plasma field source 34 operates to transfer sufficient energy to the reactant gases in the reaction chamber 12 to place them in the plasma state. The dispersion manifold 30 is connected to a bias field source 38 in order to direct molecules of the reactant gases toward the wafer substrate 18 at very high speeds. It will be understood that plasma may be otherwise generated and introduced into the reaction chamber 2 without departing from the spirit and scope of the present invention. For example, plasma may be generated by magnetically-assisted radio frequencies or microwave sources.

The chuck 16 is grounded and includes clips (not shown) or other suitable means to secure the wafer substrate 18 proximate the shower head manifold 30. A heater 39 is provided in the chuck 16. The heater 39 controls temperature in the reaction chamber 12 by transferring thermal energy to reactant gases at the surface 32 of the wafer substrate 18. The outlet port 19 is connected to a vacuum pump 40. The vacuum pump 40 typically evacuates and maintains the reaction chamber 12 at a low pressure. It will be understood that the system 10 may comprise other components or be otherwise suitably configured without departing from the scope and spirit of the present invention. For example, the system 10 may be a parallel plate PECVE reactor capable of processing a plurality of substrates at one time.

In accordance with the disclosed embodiment of the present invention, the system 10 is operable to selectively etch unwanted material from the surface 32 of the wafer substrate 18. The master flow controller 26 varies the composition and flow of gases from the gas sources 22 by controlling the flow of individual gases through the variable flow controllers 24. Each mixture of gases results in a unique set of reactants. Different sets of reactants cause different etching or buffering effects on the surface 32 of the of the substrate 18. As will be described herein, the mix of reactants can be changed to control the amount of certain buffer materials that are created and thereby the etch selectivity can be enhanced. This allows one material on the surface 32 of the wafer substrate 18 to be etched at a higher rate than another. Furthermore, some sets of reactants may result in a high etch rate of one material while allowing another material on the surface 32 to remain substantially shielded from the etch process by buffer material. By varying the composition of reactant gases over time in accordance with the teachings of the present invention, it is possible to completely remove materials with different etch rates from the surface 32 of the wafer substrate 18 without over-etching any one material. As a result, the surface 32 of the wafer substrate 18 may be etched with enhanced selectivity.

In operation, the chamber 12 is initially evacuated through the outlet port 10 and the heater 39 is activated. Reactant gases are introduced through the inlet port 14 and plasma 36 is generated from the bias field source 38. One or more reactant gases contained in the gas sources 22 are introduced into the chamber 12 through variable flow controllers 24, the manifold 28 and the shower head manifold 30. The gases are used to remove material from the surface 32 of the wafer substrate 18 through a plasma etch process in accordance with the teachings of the present invention.

Figure 2A:
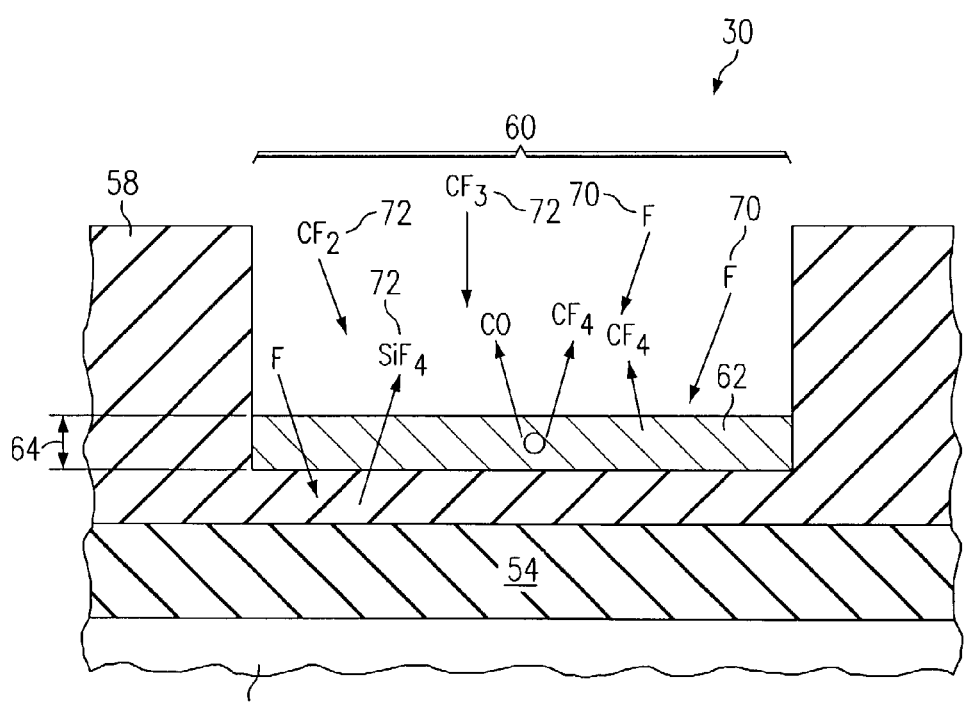
FIGS. 2A-B are cross-sectional elevational diagrams illustrating one embodiment of the plasma etch process conducted according to the teachings of the present invention.
Figure 2B:
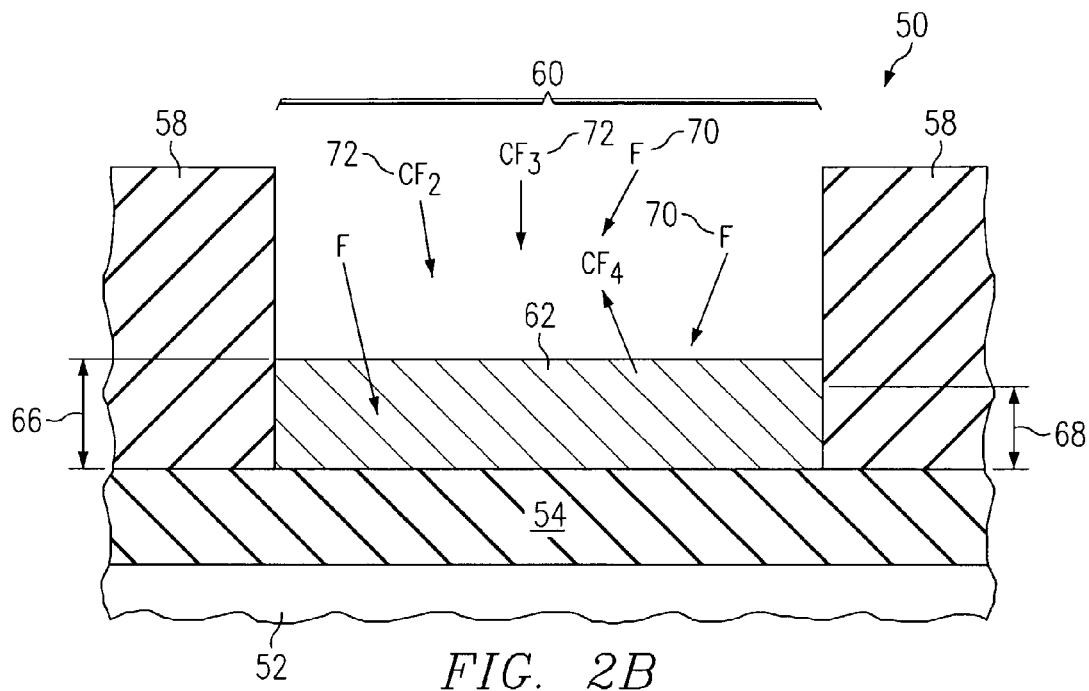

FIGS. 2A-B are cross-sectional elevational diagrams illustrating one embodiment of the plasma etch process conducted according to the teachings of the present invention. Referring to FIG. 2A, a substrate 50 comprises an interconnect layer 52 as is known in the art. Layer 52 may comprise a suitable conductive material such as aluminum, copper or doped polycrystalline silicon. An etch-stop layer 54 is deposited or otherwise formed over the interconnect layer 52. The etch-stop layer 54 typically comprises silicon nitride, but other suitable etch-stop layers as known in the art, such as silicon carbide, may also be used without departing from the scope of the present invention. The thickness of etch-stop layer 104 may be between 300 Å and 1000 Å, but any appropriate thickness may be used without departing from the spirit and scope of the present invention.

An isolation insulator layer 58 is formed over the etch-stop layer 54. In the embodiment shown in FIGS. 2A and 2B, silicon dioxide is the material used for the isolation insulator layer 58. In other embodiments, the isolation insulator layer may comprise OSG, FSG, PSG, $Al_2O_3$, a low-k dielectric, or other suitable materials known to those of ordinary skill in the art. The thickness of the isolation insulator layer 58 may be approximately 9000 Å, but may comprise other materials or thicknesses without departing from the scope of the present invention.

During the plasma etch process, the reactions result in the formation of a fluorocarbon material $CF_x$ over the isolation insulator layer 58, forming a fluorocarbon layer 62. These processes may result in the formation of approximately 50 Å of fluorocarbon material over the isolation insulator layer 58. The fluorocarbon layer 62 acts as a buffer to the isolation insulator layer 58 and the etch-stop layer 54 during the subsequent plasma etch process. It should be understood that the fluorocarbon layer 62 may comprise other materials or thicknesses without departing from the scope of the present invention.

Trenches 60 are formed on the substrate 50 in areas where connection is desired between two metal interconnect layers. Areas on the substrate 50 upon which trench etches are to be performed may be exposed by a photolithographic process or by any other method apparent to one of ordinary skill in the art. Referring to FIG. 2A, trenches 60 are etched through the isolation insulator layer 58. While the embodiment shown includes only a single trench structure, it should be understood that the advantages of the techniques and systems described are equally applicable to architectures that include vias or other combinations of trench and via structures. Trenches are etched by utilizing a plasma etch process in accordance with the teachings of the present invention. The plasma etch process reacts with the exposed portions of layer 58 and removes material from the layer 58. It is desired that the process etch through layer 58 but not substantially etch into layer 54. FIG. 2B shows a cross-sectional elevational diagram in which the trench 60 has been etched completely through the isolation insulator layer 58. The fluorocarbon layer 62 rests directly over the etch-stop layer 54 and protects layer 54 from the reactants. The embodiment of FIG. 2B represents the desired result produced from the etch process performed according to the teachings of the present invention. Because of the difficulty in assuring uniform etching throughout the surface of the substrate 50, however, it is possible for the embodiments represented in FIGS. 2A and 2B to be present simultaneously at different locations on the substrate 50.

Referring back to FIG. 2A, the thickness indicated at 64 represents a thickness of the fluorocarbon layer 62 resting over the isolation insulator layer 58 and will be referred to as $T_{cf}^{iso}$ herein. Referring to FIG. 2B, the thickness 66 represents a thickness of the fluorocarbon layer 62 resting over the etch-stop layer 58 and will be referred to as $T_{cf}^{nit}$ herein. $T_{cf}^{nit}$ 66 is typically greater than $T_{cf}^{iso}$ 64 but may comprise any relative thickness without departing from the scope of the present invention. $T_{cf}^{iso}$ 64 and $T_{cf}^{nit}$ 66 may be variable over time and will depend on the characteristics of the trench etch performed, the nature of the isolation and etch-stop materials, and as will be discussed herein, may be controlled by controlling the mixture of gas species forming the plasma.

During the plasma etch process performed according to the teachings of the present invention, ions or atoms 70 and/or gas molecules 72 are directed onto the substrate 50. This process removes the material comprising the exposed portions of isolation insulator layer 58. In the embodiment shown in FIG. 2A, fluorine ions or atoms 70 and $CF_x$ gas molecules 72 are directed onto the surface of the substrate 50. Due to the highly energetic state of the plasma, a variety of chemical interactions may take place. Some of these reactions will etch the layer 58 while others will act to increase or decrease the thicknesses of the buffer layer 62. The thicker the buffer layer 62, the more slowly the etch rate of layer 58.

Specifically, some of the fluorine ions or atoms 70 and the $CF_x$ gas molecules 72 may pass through the fluorocarbon buffer layer 62 and react with the molecular structure of the isolation insulator layer 58. This may release $SiF_4$ molecules and oxygen ions from the substrate 50, thereby having the effect of etching away the isolation insulator layer 58. Other fluorine ions or atoms 70 and $CF_x$ gas molecules 72 may react with the molecular structure of the fluorocarbon buffer layer 62. Furthermore, oxygen ions released from the isolation insulator layer 58 may also react with the $CF_x$ material in the fluorocarbon layer 62. These reactions may release $CO$ and $CF_4$ molecules from the substrate 50, thereby having the effect of partially depleting the fluorocarbon buffer layer 62.

Referring to FIG. 2B, ions or atoms 70 and gas molecules 72 may continue to react with the fluorocarbon layer 62 even after the isolation insulator layer 58 has been fully etched. However, if $T_{cf}^{nit}$ 66 is too small in value, the ions or atoms 70 and/or the gas molecules 72 may pass through the fluorocarbon layer 62 and react with the etch-stop layer 54. This may result in the undesired etching of the etch-stop layer 54. Therefore, it is the goal of the present invention to provide an etching method that will allow for the selective etching of the isolation insulator layer 58 without etching substantially into the etch-stop layer 54.

The thickness $T_{cf}^{Estop}$ 68 represents the critical thickness of the fluorocarbon layer 62. At this thickness 68, the ions or atoms 70 and/or the gas molecules 72 will pass through the fluorocarbon layer 62 to etch the isolation insulator layer 58 but will not pass through the fluorocarbon layer 62 to etch the etch-stop layer 54. Thus, it is the goal of the present invention to provide a method that will maintain the thicknesses of the fluorocarbon layers 62 at a value near that of $T_{cf}^{Estop}$ 68.

Figure 3:
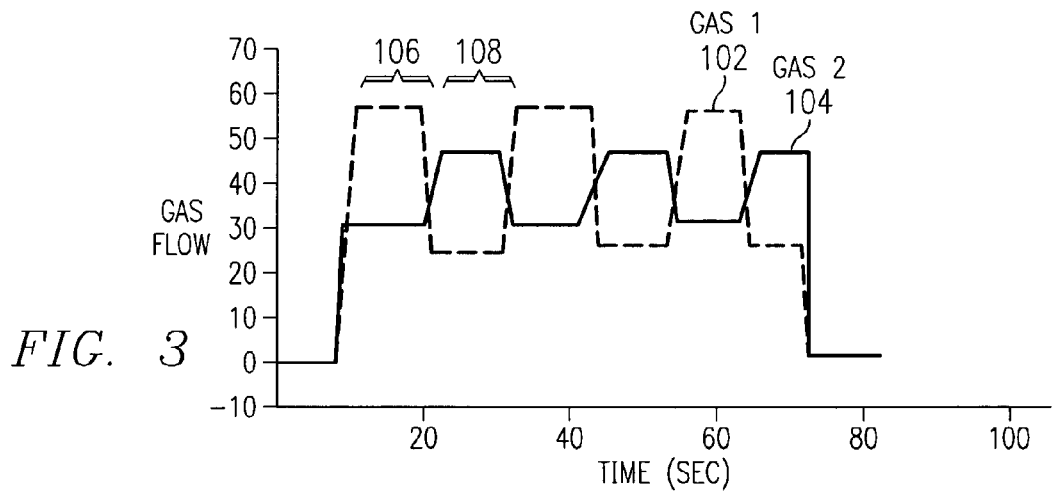
FIG. 3 is a graph illustrating a modulation of gas flow over time during one embodiment of the plasma etch process conducted according to the teachings of the present invention.

FIG. 3 is a graph illustrating a modulation of gas flow over time during one embodiment of the plasma etch process conducted according to the teachings of the present invention. The plasma etch process uses reactant gases to etch material from the substrate 50 by performing a plasma etch. The plasma etch is a process that that utilizes gas-switching in order to modulate etch characteristics, thereby allowing for higher selectivity in the etching process.

Referring to FIG. 3, the flow rates of two gases, Gas A 102 and Gas B 104, are shown in accordance with the teachings of one embodiment of the present invention. According to one embodiment of the present invention Gas A may comprise a suitable carbon and fluorine source such as $C_4F_8$, $C_5F_8$, $C_4F_6$, $CF_4$, or $NF_3$. Similarly, Gas B may comprise a suitable oxygen source such as $N_2O$, $NO$, $CO$ or $O_2$. These gases may be buffered by Argon or some other suitable nonreactive species. Time is represented by the abscissa and gas flow is level represented by the ordinate. The gas switching process uses at least two alternating steps that are repeated at least once, e.g. a primary step 106 and a secondary step 108. Additional steps may be included and repeated at least once. The primary step 106 and the secondary step 108 have different gas compositions and, therefore, different etch selectivity ratios. Similarly, additional steps, when included, have etch selectivity ratios different than the primary and secondary steps and different from one another. Differing etch selectivity ratios may be obtained by changing one or more of the gases used, changing the flow ratios, and/or changing the pressure. Remaining process parameters, including power and temperature, may or may not remain constant. It will be understood that other process parameters may otherwise be changed or altered without departing from the scope of the present invention.

Figure 4:
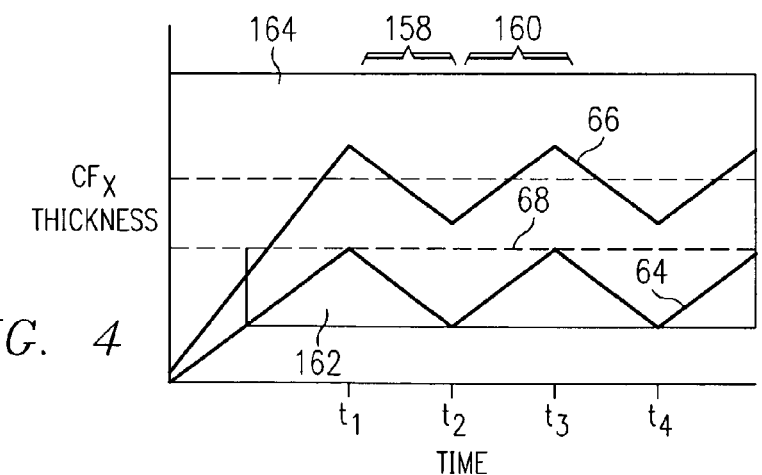
FIG. 4 is a graph illustrating the thickness of selected layers of material as a function of time during one embodiment of the plasma etch process conducted according to the teachings of the present invention.

FIG. 4 is a graph illustrating the thickness of selected layers of material as a function of time during one embodiment of the plasma etch process conducted according to the teachings of the present invention. Referring to FIG. 4, $T_{cf}^{iso}$ 64 represents the thickness of the fluorocarbon layer 62 resting on the isolation insulator layer 58 as shown in FIG. 2A. $T_{cf}^{nit}$ 66 represents the thickness of the fluorocarbon layer 62 resting on the etch-stop layer 54 as shown in FIG. 2B. $T_{cf}^{Estop}$ 68 represents the critical thickness of the fluorocarbon layer 62 as previously described. Referring further to FIG. 4, $T_{cf}^{iso}$ 64 and $T_{cf}^{nit}$ 66 are shown as functions of time. Etch time is represented by the abscissa and the thicknesses of the fluorocarbon layers 62 are represented by the ordinate. The gas switching process uses at least two alternating steps that are repeated at least once, e.g. a primary step 158 and a secondary step 160. Additional steps may be included and repeated at least once.

In the embodiment shown, the primary step 158 is an "etching" step with a high rate of etch. The etching step utilizes a gas chemistry that operates to remove material from the fluorocarbon layer 62, thereby decreasing the value of $T_{cf}^{iso}$ 64 and $T_{cf}^{nit}$ 66. A lower $T_{cf}^{iso}$ 64 value will allow the isolation insulator layer 58 to be etched at a higher rate. The secondary step 160 is a "depositing" step with a low rate of etch. The depositing step utilizes polymer deposition to build the fluorocarbon layer 62, thereby increasing the value of $T_{cf}^{iso}$ 64 and $T_{cf}^{nit}$ 66. This decreases the etch rate of the isolation insulator layer 58 and prevents the etching of the etch-stop layer 54. The primary step 158 and the secondary step 160 may be alternated so as to oscillate $T_{cf}^{iso}$ 64 and $T_{cf}^{nit}$ 66. It will be understood that the gas switching process may comprise other combinations of alternating steps without departing from the spirit and scope of the present invention.

$T_{cf}^{iso}$ 64 and $T_{cf}^{nit}$ 66 are used to predict the selectivity of etch processes. Referring to FIG. 4, a high-selectivity range 162 represents a range of thicknesses of the fluorocarbon layer 62 as shown. The high-selectivity range 162 includes a range of values of $T_{cf}^{iso}$ 64 less than but not including the value of $T_{cf}^{Estop}$ 68. The high-selectivity range 162 is the range of thicknesses of $T_{cf}^{iso}$ 64 in which enhanced selectivity may be obtained through the plasma etch process in accordance with the teachings of the present invention. When $T_{cf}^{iso}$ 64 is within the high-selectivity range 162, the ions or atoms 70 and gas molecules 72 may etch the isolation insulator layer 58 at a much higher rate than the fluorocarbon layer 62. High selectivity therefore occurs when $T_{cf}^{iso}$ 64 is greater than $T^{critical}$ and $T_{cf}^{nit}$ 66 is greater than $T^{critical}$. Therefore, it is desirable to maintain a value of $T_{cf}^{iso}$ 64 that remains within the high-selectivity range 162.

An etch-stop region 164 represents a range of thicknesses of the fluorocarbon layer greater than $T_{cf}^{Estop}$ 68, as shown in FIG. 4. The etch-stop region 164 is the range of thicknesses of $T_{cf}^{nit}$ 66 in which the etch-stop layer 54 will be protected from the plasma etch process. When $T_{cf}^{nit}$ 66 is within the etch-stop region 164, the ions or atoms 70 and gas molecules 72 may etch the fluorocarbon layer 62 but will not penetrate substantially the etch-stop layer 54. Therefore, it is desirable to maintain a value of $T_{cf}^{nit}$ 66 that remains within the etch-stop region 164. By controlling the thicknesses of the fluorocarbon layers 62 so as to maintain a $T_{cf}^{iso}$ 64 in the high-selectivity range 162 and a $T_{cf}^{nit}$ 66 above the high-selectivity range 162, enhanced selectivity in etching the substrate 50 may be achieved.

At the conclusion of the selective etch process, processing of the substrate 50 may be continued as is understood by persons skilled in the art upon reference to the description.

In other embodiments of the present invention, the etch process may contain any number of alternating steps repeated at least once. Furthermore, in some embodiments, the etch chemistries of the primary and secondary steps as described herein may be reversed such that the primary step is a depositing step and the secondary step is an etching step, each repeated two or more times. Further embodiments may include gas compositions or gas flows chosen to increase selectivity of etch of one material in preference to another, or to increase selectivity of etch of a material over an etch-stop layer material. For example, possible embodiments of the present invention include but are not limited to: an etch rate of oxide enhanced over an etch rate of nitride, an etch rate of nitride enhanced over an etch rate of oxide, an etch rate of oxide enhanced over an etch rate of silicon, an etch rate of nitride enhanced over an etch rate of silicon, an etch rate of a low-k oxide enhanced over an etch-stop layer, and an etch rate of a capacitor oxide enhanced over electrode metals.

It will be understood that the gas chemistries, flow rates, and parameters of each of the processes may be varied as necessary to obtain the desired etch result within the substrate 50. Furthermore, the gas chemistries, flow rates, and parameters of each of the processes may depend on the configuration of the system 10 or the type of plasma energy provided for the reaction.

It will be understood that the selective etch process may comprise any number or combination of steps without departing from the spirit and scope of the present invention. Other embodiments of the invention may be suggested to persons skilled in the art upon reference to the description. It is intended that the present invention encompass such changes and modifications as fall within the scope of the appended claims.

What is claimed is:

1. A method for fabricating an integrated circuit, comprising the steps of:
   providing a semiconductor body having a first layer formed thereover; and
   etching the first layer using at least a primary step to selectively remove material from the first layer and a secondary step to selectively remove material from the first layer, wherein the primary step and the secondary step are repeated at least once wherein one of either the primary or secondary step, but not both, acts to increase the thickness of a buffer layer and the other of either the primary or secondary step, but not both, acts to decrease the thickness of the buffer layer, the buffer layer acting to inhibit the etch rate of the first layer to a degree dependent on the non-zero thickness of the buffer layer during both the primary and secondary step.

2. The method of claim 1, wherein the primary step occurs at a first pressure within a plasma reaction chamber and the secondary step occurs at a second, distinct, pressure within the chamber.

3. The method of claim 1, wherein the primary step occurs at a first temperature and the secondary step occurs at a second, distinct, temperature.

4. The method of claim 1, wherein the etch process comprises at least one additional step that is repeated at least once.

5. The method of claim 1, wherein the primary step comprises a plasma etch process using a mixture of first and second gas species, the first gas species comprising a gas selected from the group consisting of $C_4F_8$, $C_5F_8$, $C_4F_6$, $CF_4$, and $NF_3$ and the second gas species comprising a gas selected from the group consisting of $N_2O$, $NO$, $CO$, $O_2$ and $O_3$.

6. The method of claim 1, wherein:
   the primary step comprises a first gas species at a first flow rate and a second gas species at a second flow rate;
   the secondary step comprises said first gas species at a third flow rate and said second gas species at a fourth flow rate;
   the first flow rate being distinct from the third flow rate.

7. The method of claim 6, wherein the second flow rate is distinct from the fourth flow rate.

8. The method of claim 1, wherein the primary step comprises a first gas chemistry and the secondary step comprises a second, distinct, gas chemistry.

9. The method of claim 8, wherein the primary step provides a high rate of etch of the first layer and the secondary step provides a polymer deposition to the buffer layer to decrease etch rate of the first layer.

10. The method of claim 8, wherein the primary step provides a polymer deposition to decrease etch rate of the first layer and the secondary step provides a high rate of etch of the first layer.

11. The method of claim 1, wherein the primary step and the secondary step provide a selective etch of one material in preference to another.

12. The method of claim 11, wherein the primary step and the secondary step provide a selective etch of one material over an etch-stop layer material.

13. The method of claim 11, wherein the primary step and the secondary step provide an etch rate of nitride enhanced over the etch rate of oxide.

14. The method of claim 11, wherein the primary step and the secondary step provide an etch rate of oxide enhanced over the etch rate of nitride.

15. The method of claim 11, wherein the primary step and the secondary step provide an etch rate of oxide enhanced over the etch rate of silicon.

16. The method of claim 11, wherein the primary step and the secondary step provide an etch rate of nitride enhanced over the etch rate of silicon.

17. The method of claim 11, wherein the primary step and the secondary step provide a selective etch of a low-k oxide over an etch-stop layer material.

18. The method of claim 11, wherein the primary step and the secondary step provide a selective etch of a capacitor oxide over an electrode metal.

19. A method for fabricating an integrated circuit, comprising the steps of:
   providing a semiconductor body having a first layer formed thereover; and
   etching a trench in the first layer using at least a primary step to selectively remove material from the first layer and a secondary step to selectively remove material from the first layer, wherein the primary step and the secondary step are repeated at least once wherein the primary step acts to increase the thickness of a buffer layer at a bottom of the trench and the secondary step acts to decrease the thickness of the buffer layer without removing said buffer layer at the bottom of the trench, the buffer layer acting to inhibit the etch rate of the first layer at the bottom of the trench to a degree dependent on the thickness of the buffer layer during both the primary and secondary step.

* * * * *